United States Patent
Omae et al.

(10) Patent No.: US 10,950,560 B2
(45) Date of Patent: Mar. 16, 2021

(54) SEMICONDUCTOR MODULE HAVING SLITS AND SHUNT RESISTOR

(71) Applicant: Mitsubishi Electric Corporation, Tokyo (JP)

(72) Inventors: Katsuhiko Omae, Tokyo (JP); Masayuki Funakoshi, Tokyo (JP); Kensuke Takeuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/404,203

(22) Filed: May 6, 2019

(65) Prior Publication Data
US 2019/0371745 A1 Dec. 5, 2019

(30) Foreign Application Priority Data
Jun. 4, 2018 (JP) .............................. JP2018-106638

(51) Int. Cl.
| | | |
|---|---|---|
| *H01L 23/64* | (2006.01) | |
| *H02K 11/26* | (2016.01) | |
| *G01R 1/20* | (2006.01) | |

(52) U.S. Cl.
CPC ............ *H01L 23/647* (2013.01); *G01R 1/203* (2013.01); *H02K 11/26* (2016.01)

(58) Field of Classification Search
CPC ......... H01L 23/49541; H01L 23/49575; H01L 23/647; H01L 23/49562; H01L 2224/37147; H01L 2224/0603; H01L 2224/48247; H01L 2224/40245; H01L 2924/13055; H01L 2924/13091; H01L 2924/00014; H01L 2924/19105; H01L 2924/181; H01L 25/18; H01L 24/48; H01L 24/06; H01L 24/40; H01L 24/37;
(Continued)

(56) References Cited

U.S. PATENT DOCUMENTS

| | | | |
|---|---|---|---|
| 2011/0285336 A1* | 11/2011 | Fujita | ...................... H01L 24/40 318/400.27 |
| 2012/0306299 A1* | 12/2012 | Masuzawa | ............ H01L 25/072 310/52 |
| 2015/0048923 A1 | 2/2015 | Kameko et al. | |

(Continued)

FOREIGN PATENT DOCUMENTS

| | | | |
|---|---|---|---|
| DE | 10 2012 215 656 A1 | 3/2014 | |
| DE | 102012215656 A1 * | 3/2014 | ....... H01L 23/49844 |

(Continued)

OTHER PUBLICATIONS

Communication dated Sep. 9, 2019, from the European Patent Office in counterpart European Application No. 19174617.1.

*Primary Examiner* — Nelson Garces
(74) *Attorney, Agent, or Firm* — Sughrue Mion, PLLC; Richard C. Turner (57) ABSTRACT

Lands (11c and 11d) are parts of base plates (104c and 104d), and electrodes of a shunt resistor (103U) are put on and connected to the lands (11c and 11d). Slits (130 and 131) are formed in the lands (11c and 11d) to separate a main electric circuit in which a main current flows and control terminals (123 and 124) with which the electric potentials of the electrodes of the shunt resistor (103U) are detected. Leading end portions of the slits (130 and 131) extend to the vicinity of the electrodes of the shunt resistor (103U).

13 Claims, 6 Drawing Sheets

(58) Field of Classification Search
CPC ....... H01L 25/072; H01L 25/16; H02K 11/26; G01R 1/203; H02P 27/06; H02M 7/00
See application file for complete search history.

(56) References Cited

U.S. PATENT DOCUMENTS

2017/0309555 A1* 10/2017 Shimakawa ...... H01L 23/49568
2018/0005733 A1    1/2018 Shinotake

FOREIGN PATENT DOCUMENTS

| | | |
|---|---|---|
| EP | 3223307 A1 | 9/2017 |
| JP | 5201171 B2 | 6/2013 |
| JP | 6223613 B1 | 11/2017 |

\* cited by examiner

SEMICONDUCTOR MODULE HAVING SLITS AND SHUNT RESISTOR

BACKGROUND OF THE INVENTION

1. Field of the Invention

The present invention relates to a semiconductor module including a built-in shunt resistor.

2. Description of the Related Art

In a semiconductor module of the related art, a plurality of terminals including a power supply terminal, which is connected to a power source, a ground terminal, which is connected to aground, an output terminal, which is used for supplying power to a motor, and a control terminal, which is used for controlling a semiconductor switching element, are arranged, and the semiconductor switching element, a shunt resistor for current detection, and other elements are arranged and connected inside the semiconductor module (see FIG. 2 of Japanese Patent No. 6223613, for example).

A semiconductor module disclosed in Japanese Patent No. 6223613 has an internal structure in which wide lands for bearing elements are provided on a plurality of base plates (corresponding to frames 41 in Japanese Patent No. 6223613) formed from copper or copper alloy plate materials, a high-potential-side switching element and a low-potential-side switching element are put on the lands, a shunt resistor is connected downstream of the low-potential-side switching element, and the other end of the shunt resistor is connected to a ground. A detection-use terminal for detecting the electric potential of an electrode of the shunt resistor is extended from an end portion of one of the lands on which the shunt resistor is put (a land of a base plate is a substantially rectangular portion of the base plate excluding a control terminal or other terminal). The detection-use terminal extended from one of the lands that is connected to the ground is positioned apart from an electrode at the left end of the shunt resistor due to the layout of the terminals.

The lands are all formed wide in order to have a large surface area for the purpose of cooling by efficiently transmitting heat of the base plates to a heat sink, which makes the distance between the detection-use terminal and the electrode even longer.

Figure 1:
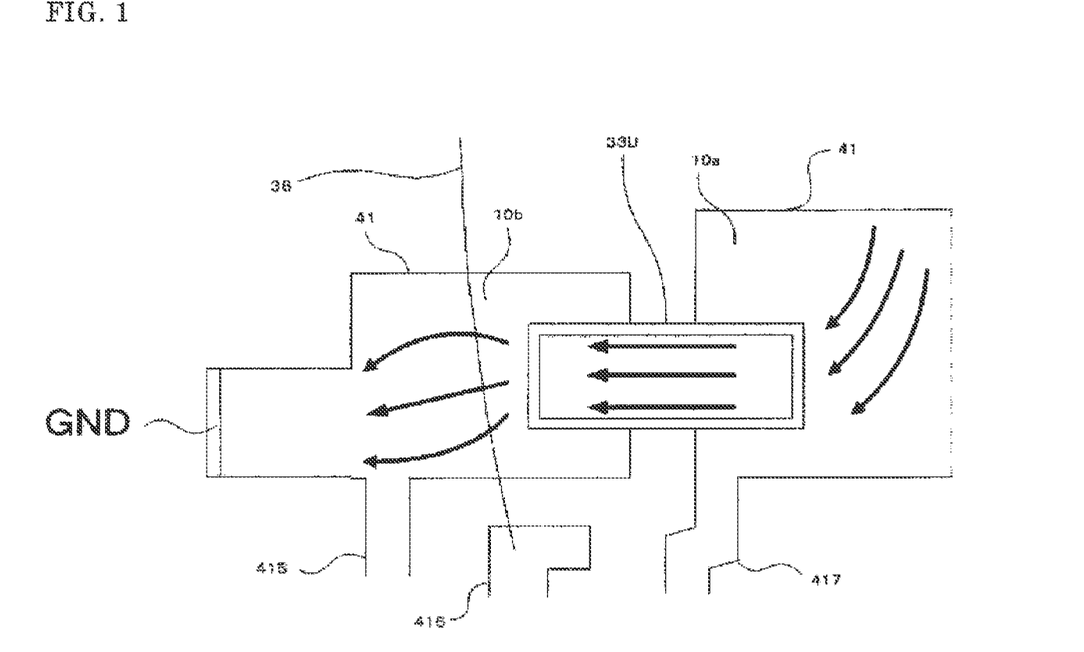
FIG. 1 is an enlarged view of apart of a semiconductor module disclosed in FIG. 2 of Japanese Patent No. 6223613.

A problem that arises in the semiconductor module disclosed in Japanese Patent No. 6223613 is described next. FIG. 1 is an enlarged view of a part of the semiconductor module disclosed in Japanese Patent No. 6223613. The arrows in FIG. 1 indicate flows of a current, which run separately along a plurality of paths including a linear path and a curving path.

Base plates 41, though formed of copper or a copper alloy, have a slight electrical resistance, a value of which is in proportion to the length of an electric circuit. As a shunt resistor 33U in, for example, an electric power steering device configured to detect a current of about 100 A, a shunt resistor having a resistance of about 1 mΩ is used in order to control heat generation and voltage drop of the shunt resistor. A detection-use terminal 415 is at a long distance from an electrode at the left end of the shunt resistor 33U due to the layout of the terminals as described above, resulting in a unignorable level of electrical resistance.

Figure 2:
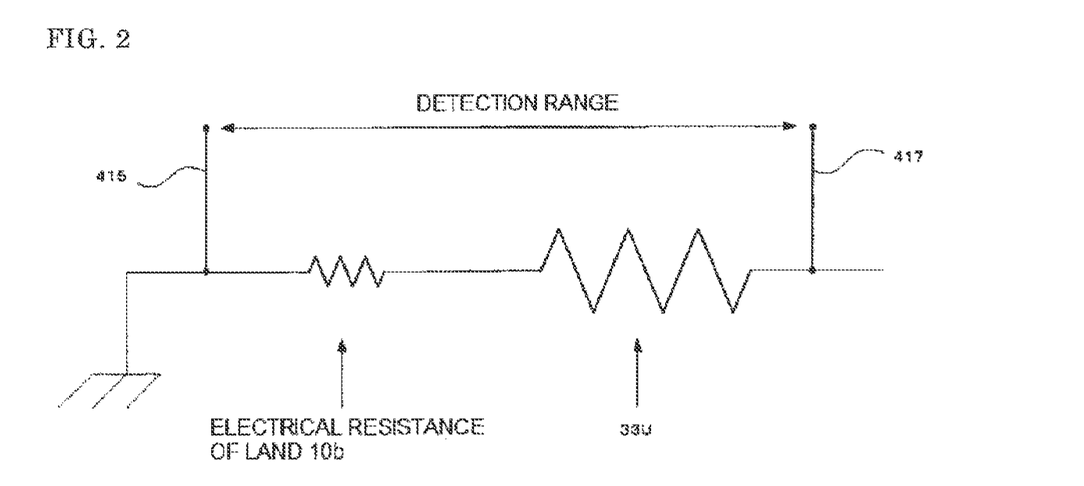

This is illustrated in FIG. 2 in the form of a circuit diagram. Generating a current flow in the base plates 41 is equivalent to letting a current flow against the electrical resistance described above, which causes a voltage drop. The detection-use terminal 415 and a detection-use terminal 417 unfortunately detect an electric potential difference that includes, in addition to the electric potentials of electrodes at both ends of the shunt resistor 33U, the voltage drop due to the electrical resistance as illustrated in FIG. 2. The voltage drop acts as an error that hinders precise measurement of an electric potential difference between both the ends of the shunt resistor 33U, thereby causing a problem in that the current detection precision is low.

Further, a change in temperature causes the electrical resistance value of copper or a copper alloy to fluctuate as well known. Heat generated in the base plates 41 by a current flow in the base plates 41 changes the temperature and consequently causes the electrical resistance value to fluctuate. With the electrical resistance value fluctuated, the voltage drop there fluctuates even when the current flowing against the electrical resistance has a constant current value, which means that the electric potential difference between the detection-use terminals 415 and 417 varies depending on the temperature. This makes the current detection precision even lower.

SUMMARY OF THE INVENTION

The present invention has been made to solve the problem described above, and an object of the present invention is therefore to provide a semiconductor module improved in current detection precision by measuring an electric potential difference between both ends of a shunt resistor with precision.

According to one embodiment of the present invention, there is provided a semiconductor module, including: a plurality of base plates, each being formed into a plate shape from a conductive material; power terminals to be extended from the plurality of base plates; lands, which are parts of the plurality of base plates, and are to be used for placement and connection of elements; switching elements to be put on and connected to the lands to control a current flowing in the power terminals; and a shunt resistor to be put on and connected to part of the lands, in which the lands on which the shunt resistor is put and to which the shunt resistor is connected have slits formed so as to cut the lands into a main electric circuit in which a main current flows and detection-use terminals configured to detect electric potentials of electrodes of the shunt resistor, and in which the slits have leading end portions extending to vicinity of the electrodes of the shunt resistor.

According to the semiconductor module of the present invention, the slits are formed in the lands on which the shunt resistor is put and to which the shunt resistor is connected so that the leading end portions of the slits extend to the vicinity of the electrodes of the shunt resistor, thereby separating the main electric circuit in which the main current flows from the detection-use terminals. This restricts the flow of the main current to the detection-use terminal side and consequently prevents the voltage drop described above from happening, to thereby prevent the detection of an electric potential difference that includes the voltage drop. The electric potential difference between both the ends of the shunt resistor can precisely be measured as a result, which leads to an improvement in current detection precision.

BRIEF DESCRIPTION OF THE DRAWINGS

FIG. 2 is a diagram in which FIG. 1 is expressed as a circuit diagram.

DESCRIPTION OF THE EMBODIMENTS

First Embodiment

Figure 3:
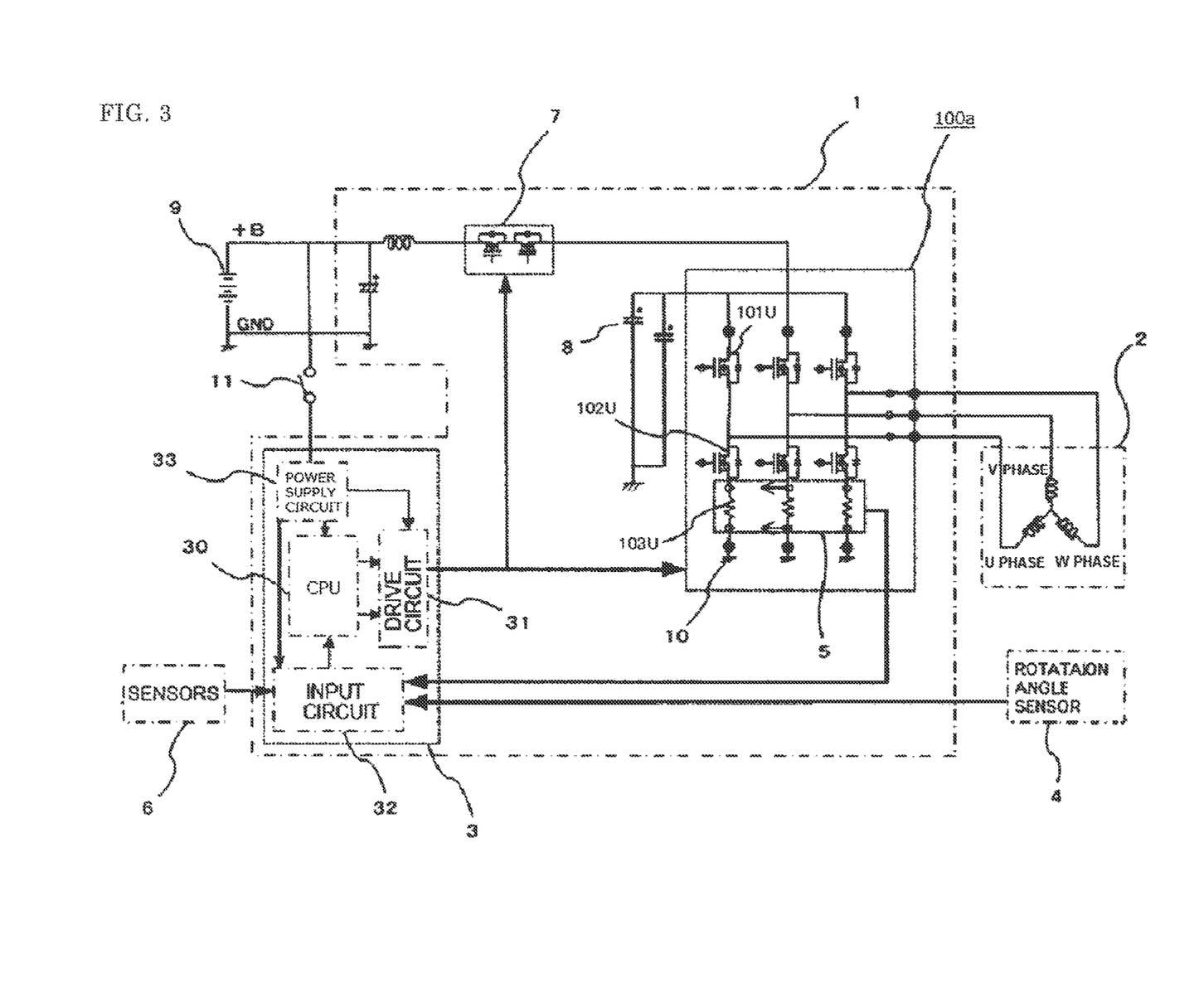
FIG. 3 is an overall circuit diagram of an electric power steering device including a semiconductor module 100a according to a first embodiment of the present invention.

A device using a semiconductor module 100a according to a first embodiment of the present invention is described. A case of installing the semiconductor module 100a in an electric power steering device is described here as an example. FIG. 3 is an overall circuit diagram of the electric power steering device including the semiconductor module 100a. The electric power steering device is roughly divided into a control unit 1, a motor 2 for assisting wheel steering, a rotation angle sensor 4, a current sensor 5, and sensors 6, which are other than the rotation angle sensor 4 and the current sensor 5. The control unit 1 includes a control circuit 3, a power supply relay 7 for supplying power, smoothing capacitors 8, and the semiconductor module 100a. The motor 2 is a three-phase (a U phase, a V phase, and a W phase) brushless motor. The control circuit 3 includes a CPU 30, a drive circuit 31, an input circuit 32, and a power supply circuit 33. The rotation angle sensor 4, the current sensors 5, and the sensors 6 are electrically connected to the control circuit 3. A shunt resistor is used as the current sensor 5 in the present invention. The plurality of smoothing capacitors 8 are connected in parallel between a power source 9 and a ground 10.

When an ignition switch 11 is switched on, the power supply circuit 33 starts supplying power to the CPU 30, the drive circuit 31, and the input circuit 32. A signal is output from the input circuit 32 to the CPU 30 based on rotation angle information, which is detected by the rotation angle sensor 4, current value information, which is detected for each phase by the current sensor 5, and steering torque information and vehicle speed information, which are detected by the sensors 6. The CPU 30 calculates from those pieces of information a target current for driving the motor 2, and issues an output command based on deviation of the current value information from the target current to the drive circuit 31. The drive circuit 31 drives elements of the semiconductor module 100a and of the power supply relay 7 as dictated by the output command.

The semiconductor module 100a according to the first embodiment includes bridge circuits of three phases because the motor 2 is a three-phase (the U phase, the V phase, and the W phase) motor as described above. The bridge circuits of three phases are each independent and have the same circuit configuration. Only the bridge circuit of one phase (the U phase) is therefore described. In the semiconductor module 100a, a high-potential-side switching element 101U and a low-potential-side switching element 102U are connected in series, and a coil (load output) of the motor 2 to which power is supplied is connected to an intermediate connection point between the switching elements. A shunt resistor 103U for detecting a current is connected downstream of the low-potential-side switching element 102U. The power source 9 is connected to the high-potential-side switching element 101U via the power supply relay 7. The ground 10 is connected to the other end of the shunt resistor 103U.

The semiconductor module 100a of the electric power steering device configured as described above has control terminals, which are represented by circle marks in FIG. 3, and power terminals, which are represented by double-circle marks in FIG. 3. The power terminals here mean terminals connected to the power source 9, the ground 10, and the motor 2. The control terminals mean low-power terminals used for control or detection, here, gate command terminals for the high-potential-side switching element 101U and the low-potential-side switching element 102U, detection-use terminals connected to electrodes at both ends of the shunt resistor 103U, a monitoring terminal for detecting an electric potential at the intermediate connection point between the high-potential-side switching element 101U and the low-potential-side switching element 102U, and other similar terminals.

Figure 4A:
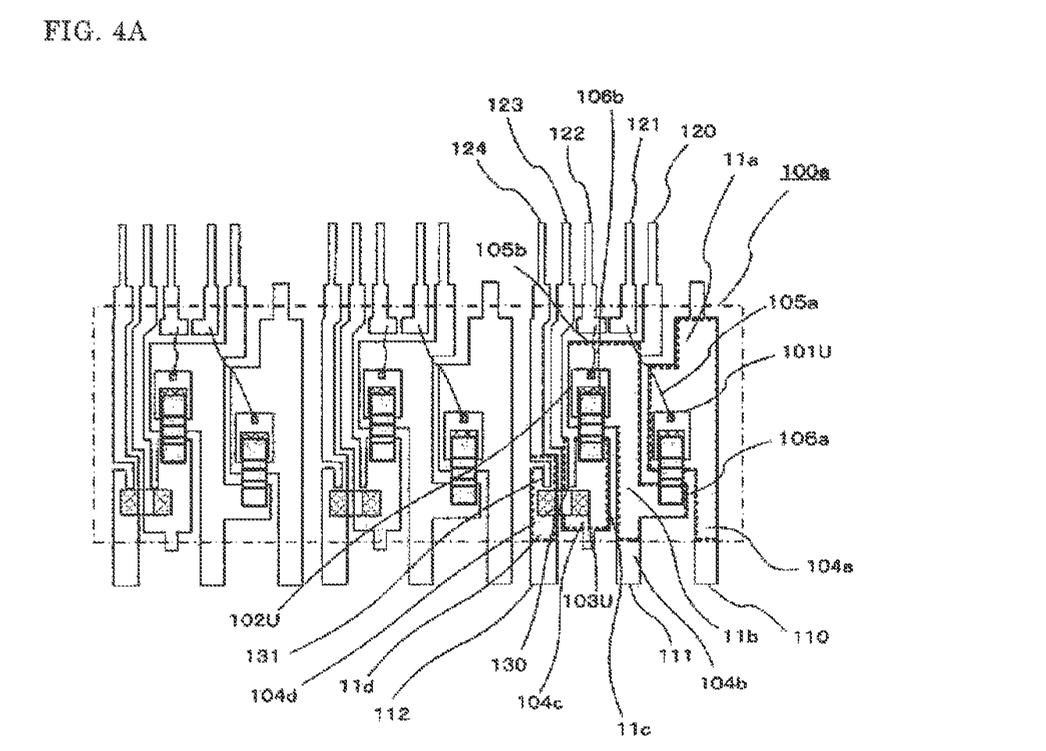
FIG. 4A and FIG. 4B are diagrams for illustrating the internal configuration of the semiconductor module 100a according to the first embodiment of the present invention.
Figure 4B:
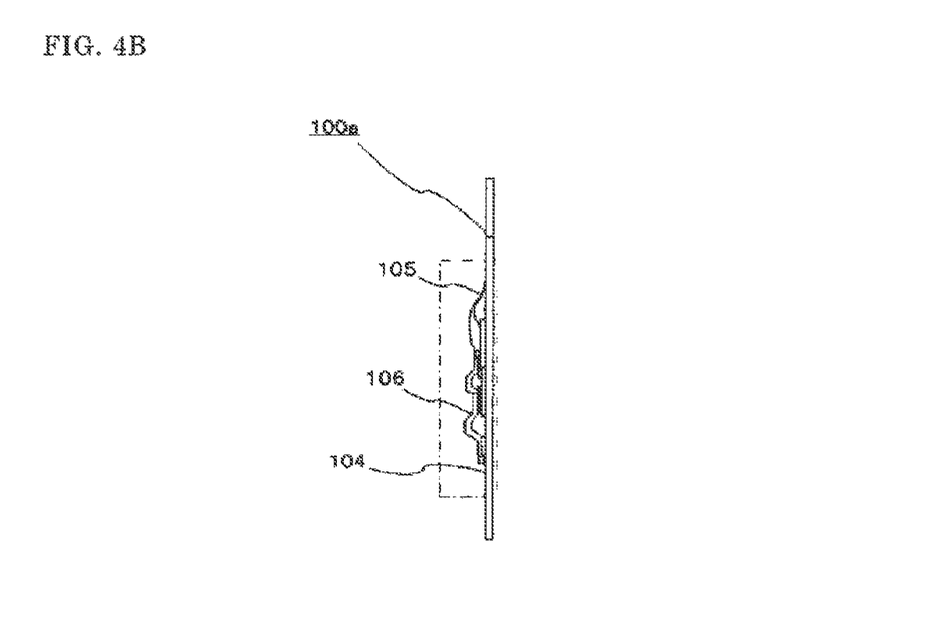

The internal configuration of the semiconductor module 100a according to the first embodiment is described next. FIG. 4A is a frontal perspective view for illustrating the internal configuration of the semiconductor module 100a, and FIG. 4B is a side perspective view of the semiconductor module 100a. A portion enclosed by the dot-dash line is a mold resin body wrapped around the semiconductor module 100a. The control terminals and the power terminals extend to the outside of the mold resin body. Because the bridge circuits of three phases in the motor 2 are each independent and have the same circuit configuration, a description is given only on the bridge circuit of the U phase, which is on the right hand side in FIG. 4A. The semiconductor module 100a includes a plurality of plate-shaped base plates 104 formed of copper or a copper alloy. Lands 11a to 11d (a portion enclosed by the dotted line in FIG. 4A) are formed wide so that the shunt resistor 103U, semiconductor switching elements, and other elements are put on and connected to the lands 11a to 11d. Terminals extend from the lands 11a to 11d and, in the U-phase bridge circuit, the power terminals, that is, a power supply terminal 110 connected to the power source, a monitor output terminal 111 connected to the coil of the motor 2 to which power is supplied, and a ground terminal 112 connected to the ground, are aligned in order from a lower right portion of FIG. 4A.

The control terminals are aligned with respect to a side opposed to the line of power terminals. A control terminal 120 is a monitoring terminal for detecting the electric potential of a base plate 104b. Control terminals 121 and 122 are gate command terminals for applying voltages to a gate of the high-potential-side switching element 101U and a gate of the low-potential-side switching element 102U, respectively. Control terminals 123 and 124 are detection-use terminals for detecting the electric potentials of the electrodes at both ends of the shunt resistor 103U, and extend respectively from the land 11c and the land 11d on which/to which the electrodes of the shut resistor 103U are put/connected. A current can be calculated by conversion from an electric potential difference between the electrodes at both the ends of the shunt resistor 103U. In other words, a base plate 104a to a base plate 104d are made up of lands, power terminals, and control terminals.

The high-potential-side switching element 101U and the low-potential-side switching element 102U are each a MOSFET (hereinafter shortened to "FET"). The high-potential-side switching element 101U has a drain portion connected to the base plate 104a. A source portion of the high-potential-side switching element 101U is above the drain portion and is connected to one end of a jumper line 106a. The other end of the jumper line 106a is connected to the base plate 104b. The low-potential-side switching element 102U is put on and connected to the base plate 104b. A drain portion of the low-potential-side switching element 102U is connected to the base plate 104b. A source portion of the low-potential-side switching element 102U is above the drain portion and is connected to one end of a jumper line 106b. The other end of the jumper line 106b is connected to the base plate 104c. The jumper lines 106a and 106b are formed of copper or a copper alloy as well, and have a bridge-like shape as illustrated in FIG. 4B. A wire bond 105a connects the control terminal 121 and the gate of the high-potential-side switching element 101U. A wire bond 105b connects the control terminal 122 and the gate of the low-potential-side switching element 102U.

The electrode at one end of the shunt resistor 103U is put on and connected to the base plate 104c. The electrode at the other end of the shunt resistor 103U is put on and connected to the base plate 104d.

Slits 130 and 131 formed in the base plates 104c and 104d, respectively, are described next. The slits 130 and 131 are formed so that leading end portions of the slits 130 and 131 extend from perimeter portions of the lands 11c and 11d to the vicinity of the electrodes of the shunt resistor 103U.

Figure 5:
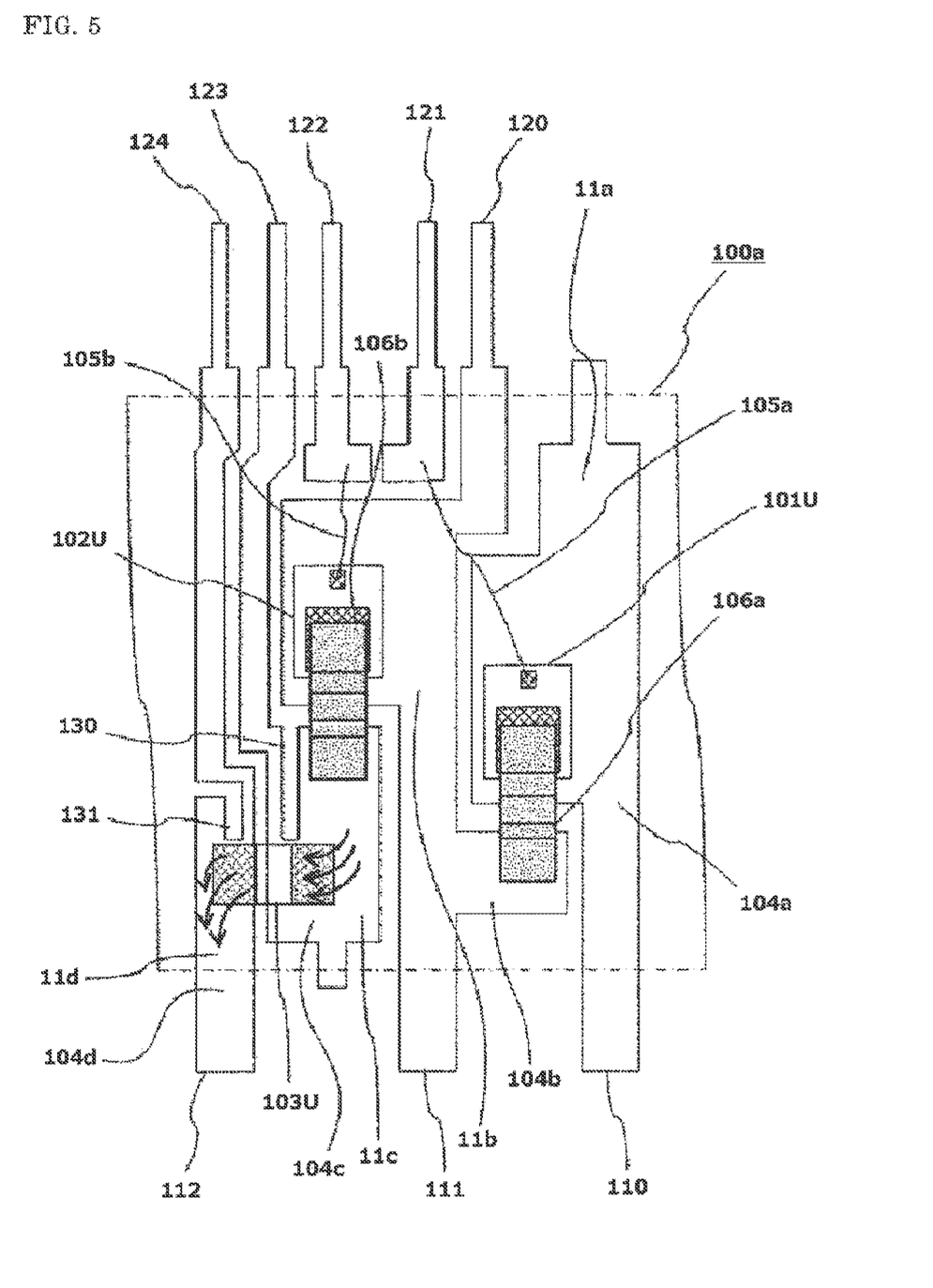
FIG. 5 is an enlarged view of a U-phase part out of the internal configuration of the semiconductor module 100a of FIG. 4A and FIG. 4B.

FIG. 5 is an enlarged view of the U-phase part out of the internal configuration of the semiconductor module 100a of FIG. 4A and FIG. 4B. The arrows in FIG. 5 imitate flows of a current, which is calculated by conversion from the electric potentials of the electrodes of the shunt resistor 103U detected by the control terminals 123 and 124. When the electric potentials of the electrodes of the shunt resistor 103U are detected, a voltage drop due to a current flow curving toward the control terminals 123 and 124 is detected as well, as in the problem of the related art, with the result that current detection precision is lowered. This is addressed by forming the slit 130, which has a linear shape, and the slit 131, which has the shape of a letter L, so that the leading end portions of the slits 130 and 131 extend to the vicinity of the electrodes of the shunt resistor 103U. The slits 130 and 131 cut the lands 11c and 11d into a main electric circuit path in which a main current flows and the control terminals 123 and 124, thereby restricting the flow of the main current toward the control terminals 123 and 124.

By restricting the flow of the main current toward the control terminals 123 and 124, the control terminals 123 and 124 are prevented from detecting a voltage drop in the lands 11c and 11d during the detection of the electric potentials at both the ends of the shunt resistor 103U, with the result that the electric potential difference between both the ends of the shunt resistor 103U is measured with precision. The current detection precision can accordingly be improved.

Another advantage is that the electrical resistance of the lands 11c and 11d does not affect an area inside a detection range of the control terminals 123 and 124, which corresponds to a detection range illustrated in FIG. 2, because a path along which the main current flows toward the control terminals 123 and 124 is cut off by the slits 130 and 131 formed so as to cut the lands 11c and 11d into the main electric circuit and the control terminals 123 and 124. The area is accordingly not affected by a change in temperature even when the temperature of the base plates 104c and 104d changes, and the current detection precision can be maintained in this manner.

A case in which a semiconductor module is installed in an electric power steering device is considered as an example. The motor is driven by supplying power to the bridge circuits of three phases. When a current flowing in the base plates of one phase has a different value from that of a current flowing in the base plates of another phase, the amount of heat generated differs and the base plate temperature differs as well between the circuits of the one phase and the other phase. The temperature difference causes a difference in electrical resistance value between the circuits of the one phase and the other phase. Therefore, in a semiconductor module of the related art in which the slits are not formed in the base plates, an error included in the current detection value also differs between the circuits of the one phase and the other phase as described above. Because the control unit performs control based on information containing the errors, power supplied to the coils of the one phase and the other phase is made non-uniform by the difference between the errors. The non-uniform power causes a torque ripple, which is felt as a feeling of strangeness in wheel steering.

With the slits formed in the base plates, the curving of a current flow as the cause of the error is restricted and the detection-use terminals are prevented from additionally detecting the error, thereby enabling the control unit to perform control based on appropriate information, so that uniform power is supplied to the coil of one phase and the coil of another phase. The torque ripple can accordingly be prevented.

To give an example, an electric power steering device in which the thickness of each base plate is set to 0.6 mm and the distance of the leading end portions of the slits from the electrodes of the shunt resistor is set to 1 mm has had an error of approximately ±2%, and has successfully prevented the torque ripple described above.

An alignment relation between the line of power terminals and the line of control terminals is described next. The power terminals are all aligned in a lower part of the semiconductor module 100a in FIG. 4A. The control terminals, on the other hand, are all aligned with respect to the upper side opposed to the line of power terminals.

By aligning the line of power terminals and the line of control terminals with respect to different sides apart from each other in this manner, the control terminals are pulled away from switching noise generated when on/off control of the current is performed, and can accordingly be improved in noise tolerance capacity.

A positional relationship between the ground terminal 112 and the shunt resistor 103U is described next. A semiconductor module is known in which, as illustrated in FIG. 20 of Japanese Patent No. 5201171, for example, a line of power terminals and a line of control terminals are aligned so as to oppose each other on base plates, and each shunt resistor is put on and connected to a part of the base plates on the side where the line of control terminals is located. In a semiconductor module having this configuration, the distance from the ground terminal to the electrodes of the shunt resistor is long, which causes an unignorable inductance component between the ground terminal and the electrodes of the shunt resistor. The inductance generates a self-induced electromotive force when switching control of a semiconductor switching element is performed. The self-induced electromotive force triggers a malfunction of a current detection circuit (e.g., a differential amplifier circuit) when detection is executed with the current detection circuit, which leads to an error in current detection and invites the lowering of current detection precision.

The inductance can be reduced to an ignorable level by putting/connecting the electrodes at both the ends of the shunt resistor 103U on/to the side where the line of power terminals is located and the ground terminal 112 is aligned as illustrated in FIG. 4A, thus shortening the distance from the ground terminal 112 to the electrodes of the shunt resistor 103U. Consequently, a current detection error due to the self-induced electromotive force is prevented, and current detection precision can be secured.

Moreover, the semiconductor module 100a in which the bridge circuits of three phases are together encased in a resin mold to be integrated into one has a better prospect for reduction in size and space than a semiconductor module obtained by wiring three semiconductor modules, which are arranged side by side and in each of which a bridge circuit of one phase is encased in a resin mold.

Second Embodiment

Figure 6:
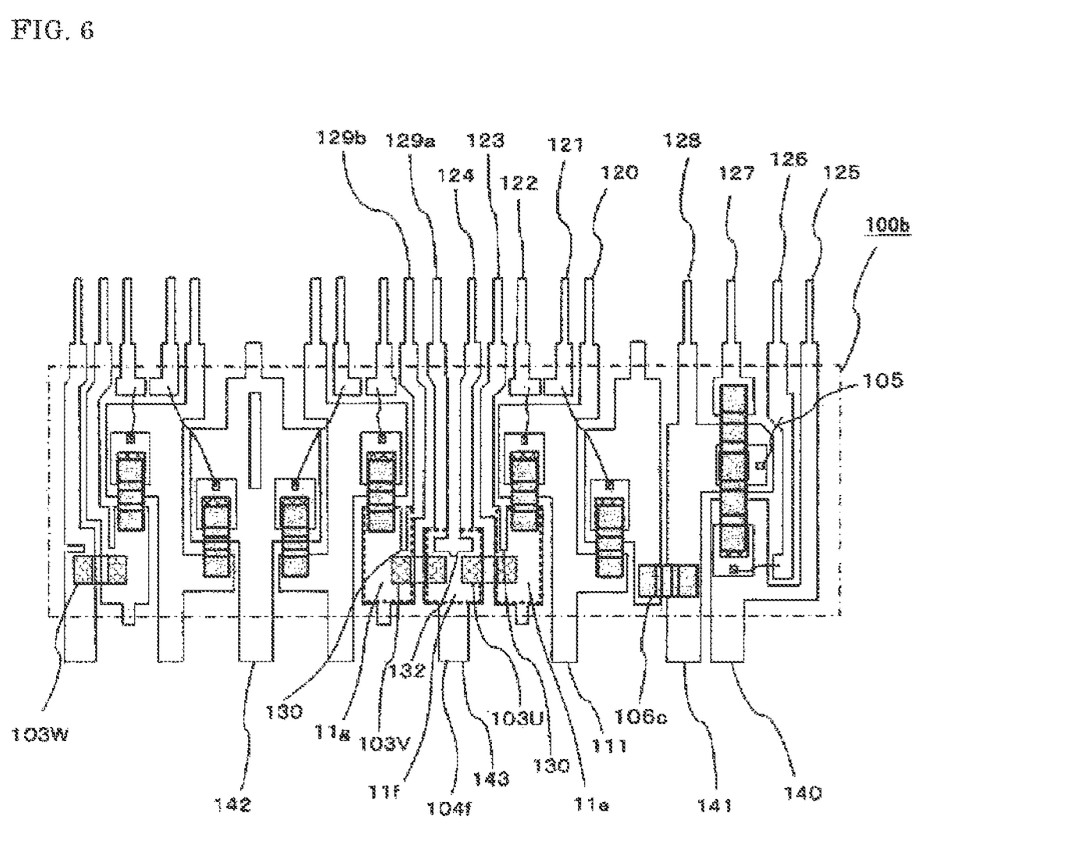
FIG. 6 is a diagram for illustrating the internal configuration of a semiconductor module 100b according to a second embodiment of the present invention.

A semiconductor module 100b according to a second embodiment of the present invention is described. FIG. 6 is a diagram for illustrating the internal configuration of the semiconductor module 100b. A portion enclosed by the dot-dash line is a mold resin body wrapped around the semiconductor module 100b. Power terminals and control terminals extend to the outside of the mold resin body. The semiconductor module 100b has a circuit configuration in which the power supply relay 7 of FIG. 3 is added to the circuit configuration of the semiconductor module 100a according to the first embodiment. The power supply relay 7 is constructed from FETs as the semiconductor switching elements are, and is placed at the right end of the semiconductor module 100b. The power supply relay 7, the U-phase bridge circuit, the V-phase bridge circuit, and the W-phase bridge circuit are arranged in order from the right end of the semiconductor module 100b. A line of power terminals and a line of control terminals are aligned with respect to the lower side and the upper side, respectively, in FIG. 6 at a distance from each other.

The line of power terminals additionally includes an input terminal 140 and an output terminal 141, which are input/output terminals of the power supply relay 7. Focusing on the arrangement of the bridge circuits of three phases, the U-phase bridge circuit and the W-phase bridge circuit placed on the right side and the left side, respectively, of the semiconductor module 100b have the same arrangement of components, whereas the V-phase bridge circuit in the middle has a reverse arrangement of components, so that the bridge circuits of three phases are arranged axisymmetrically (a mirrored arrangement). With the V-phase bridge circuit in the middle configured so that axisymmetric arrangement is obtained in this manner, a power supply terminal 142 is shared by the bridge circuits of two phases (the V phase and the W phase), and a ground terminal 143 is shared by the bridge circuits of a different combination of two phases (the U phase and the V phase), thereby reducing the number of terminals.

While the bridge circuits of three phases are taken here as an example, the number of terminals can be reduced also in bridge circuits of a plurality of phases equal to or more than two phases by arranging at least a bridge circuit of one phase and an adjacent bridge circuit of a different phase axisymmetrically, and sharing a power supply terminal, a ground terminal, or other terminal between the bridge circuits of two phases that are axisymmetric to each other.

Current control in each phase is discussed in detail. The maximum current that can flow in a power terminal is determined by the shape of the terminal, the maximum rated current value of a semiconductor chip, or the like. The terminal size suitable for the maximum current is defined by width and thickness. It is common to use a balanced three-phase circuit in a three-phase motor, and, because maximum currents of two phases do not flow concurrently, one terminal can serve as the power supply terminal 142 for the circuit of one phase and the power supply terminal 142 for the circuit of another phase without letting the flowing current exceed the prescribed maximum current amount. The same applies to the ground terminal 143. The shared power supply terminal 142 or the shared ground terminal 143 can have substantially the same width and thickness as when the circuits of three phases are independent of one another without causing a problem. That is, the overall size of the semiconductor module 100b can be reduced because a power supply terminal or a ground terminal that is shared by circuits of two phases can have substantially the same width and thickness as those of a power supply terminal or a ground terminal for the circuits of three phases that are independent of one another, and the number of terminals can accordingly be reduced.

A power input terminal for the U phase is extended to the left of the output terminal 141 of the power supply relay 7. The power supply relay 7 can accordingly be connected to the U-phase bridge circuit with the use of a jumper line 106c inside the semiconductor module 100b.

Regarding the line of control terminals, the control terminals 120 to 124 for the U-phase bridge circuit are aligned in the same way as in the first embodiment. Control terminals 125, 126, 127, and 128 in a power supply relay portion are a power input monitoring terminal, gate command terminals for the two FETs inside the power supply relay 7, a monitoring terminal at an intermediate connection point between the two FETs inside the power supply relay 7, and a power output monitoring terminal, respectively.

A slit 132 formed in the semiconductor module 100b is described next. The slit 132 is a single notch functioning as two slits, and can be formed by configuring the V-phase bridge circuit so that the bridge circuits of three phases are arranged axisymmetrically, and putting two shunt resistors on a land 11f (one of portions enclosed by the dotted lines in FIG. 6), which is a part of a base plate 104f. The slit 130 is also formed in each of lands 11e and 11g (the other portions enclosed by the dotted lines in FIG. 6) as in the first embodiment, to thereby separate the main electric circuit from the control terminal 123 and a control terminal 129b.

This restricts the flow of the main current toward the control terminals 123, 124, and 129b and a control terminal 129a as in the first embodiment, thereby preventing the control terminals 123, 124, 129a, and 129b from additionally detecting a voltage drop in the lands 11e, 11f, and 11g during the detection of electric potentials at both the ends of the shunt resistor 103U and both ends of a shunt resistor 103V, with the result that the electric potential differences between both the ends of the shunt resistor 103U and between both the ends of the shunt resistor 103V are measured with precision. The current detection precision can accordingly be improved.

The electric potential differences between both the ends of the shunt resistor 103U and between both the ends of the shunt resistor 103V are detected with the control terminals 123, 124, 129a, and 129b by designing the control terminals 123 and 124 so as to extend from the electrodes at both the ends of the shunt resistor 103U, and designing the control terminals 129a and 129b so as to extend from electrodes at both the ends of the shunt resistor 103V. This gives another advantage in that detection of the electric potential of the shunt resistor of another phase is prevented, which helps to secure the current detection precision.

Third Embodiment

Figure 7A:
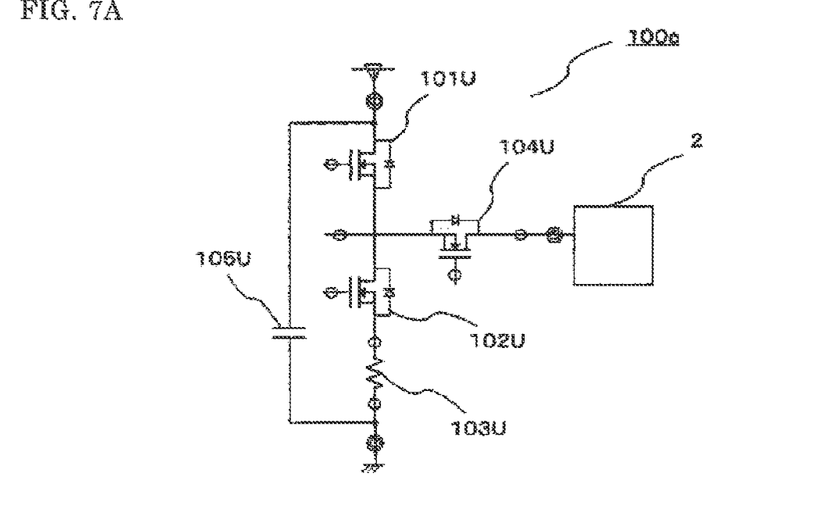
FIG. 7A and FIG. 7B are respectively abridge circuit diagram for illustrating a bridge circuit of one phase out of a semiconductor module 100c according to a third embodiment of the present invention, and a diagram of the internal configuration of the bridge circuit configured as a semiconductor module.
Figure 7B:
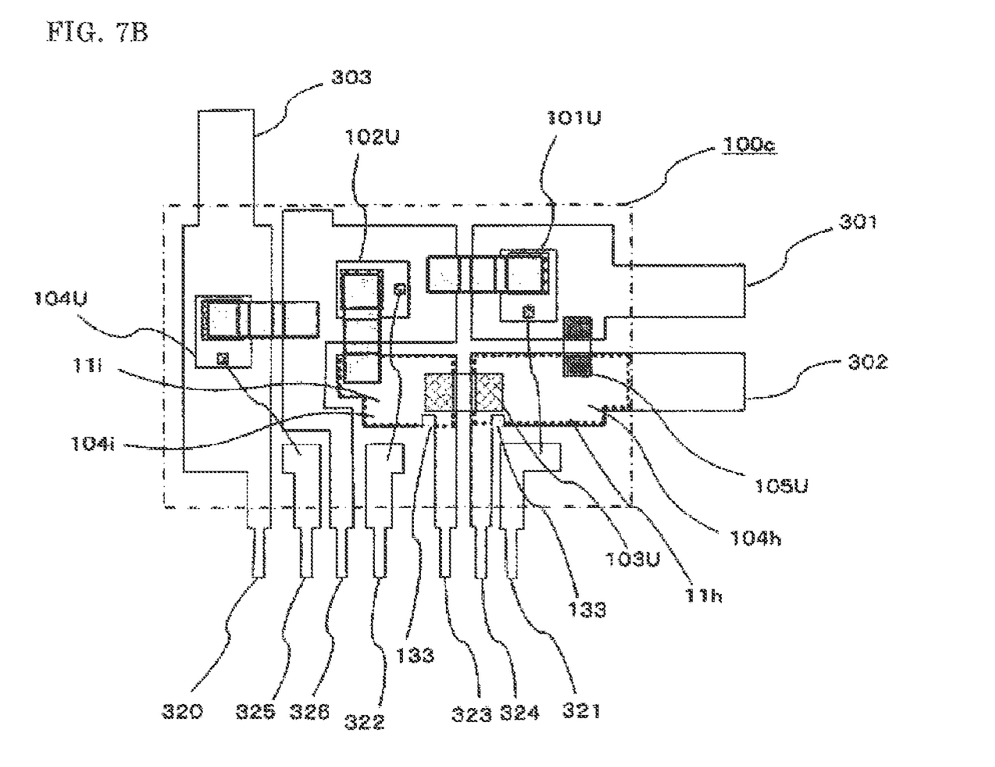

A semiconductor module 100c according to a third embodiment of the present invention is described. FIG. 7A is a circuit diagram for illustrating a bridge circuit of one phase (the U phase) out of a three-phase inverter, and FIG. 7B is an internal perspective view of the bridge circuit configured as a semiconductor module. A portion enclosed by the dot-dash line in FIG. 7B is a mold resin body wrapped around the semiconductor module 100c. Power terminals and control terminals extend to the outside of the mold resin body.

As illustrated in FIG. 7A, the bridge circuit includes, in addition to the high-potential-side switching element 101U, the low-potential-side switching element 102U, and the shunt resistor 103U, a semiconductor switching element 104U, which is inserted to an output line leading to the motor 2 for on/off control of a current to the motor 2. The semiconductor switching element 104U, too, is an FET. A high-frequency noise suppression capacitor 105U is provided between a power source and a ground. Terminals (circle marks) for monitoring voltages in the components are provided as well. This bridge circuit of one phase is turned into a semiconductor module in which components are arranged and connected as illustrated in FIG. 7B, for example.

The power terminals are a power supply terminal 301, a ground terminal 302, and a motor output terminal 303. A line of control terminals is made up of control terminals 320, 321, 322, 323, 324, 325, and 326. The control terminal 320 is a monitoring control terminal for detecting the electric potential of a motor output. The control terminal 321 is used to issue a gate command to the high-potential-side switching element 101U. The control terminal 322 is used to issue a gate command to the low-potential-side switching element 102U. The control terminals 323 and 324 detect electric potentials at both the ends of the shunt resistor 103U. The control terminal 325 is used to issue a gate command to the semiconductor switching element 104U. The control terminal 326 is a monitoring control terminal in an intersection portion where three switching elements, specifically, the high-potential-side switching element 101U, the low-potential-side switching element 102U, and the semiconductor switching element 104U intersect with one another.

Slits 133 are described next. While the main purpose of forming wide lands is to increase the surface area so that base plates are cooled by efficiently transmitting the heat of the base plates to a heat sink as described above, other purposes include increasing the cross-sectional area for an efficient flow of current.

However, when the linear slit 130 and the L-shaped slit 131 extend to the midsections of the lands 11c and 11d as in the first embodiment, the cross-sectional area of the main electric circuit formed on the lands 11c and 11d and heat radiation areas of the lands 11c and 11d are small, and the heat radiation performance and current propagation efficiency of the base plates 104c and 104d are accordingly low (see FIG. 5).

As a solution, the control terminals 323 and 324 are extended along an electrode width direction of the shunt resistor 103U as illustrated in FIG. 7B from corner portions closest to places on which the electrodes of the shunt resistor 103U are put, out of lands 11h and 11i (portions enclosed by the dotted lines in FIG. 7B) on/to which the electrodes of the shunt resistor 103U are put/connected. The slits 133 are then formed so that leading end portions of the slits 133 extend to the vicinity of the electrodes of the shunt resistor 103U, along the electrode width direction of the shunt resistor 103U. The lands 11h and 11i are thus cut into the main electric circuit and the control terminals 323 and 324 while securing sufficient heat radiation area of the lands 11h and 11i and a sufficient cross-sectional area of the main electric circuit. This restricts the flow of the main current toward the control terminals 323 and 324 as in the first embodiment, thereby preventing the control terminals 323 and 324 from additionally detecting a voltage drop in the lands 11h and 11i during the detection of electric potentials at both the ends of the shunt resistor 103U, with the result that the electric potential difference between both the ends of the shunt resistor 103U is measured with precision. The current detection precision can accordingly be improved.

In addition, base plates 104h and 104i can have high heat radiation performance and current propagation efficiency by securing sufficient heat radiation areas of the lands 11h and 11i and a sufficient cross-sectional area of the main electric circuit.

The slits in the present invention cut lands into the main electric circuit in which the main current flows and detection-use terminals, by extending the leading end portions of the slits to the vicinity of electrodes of a shunt resistor. The slits can be set to any shape, thickness, and length as long as a current flowing in the lands on the detection-use terminal side can be restricted.

The base plates used in the first to third embodiments are formed of copper or a copper alloy, but base plates formed of other conductive materials may be used.

An example of connecting the shunt resistor downstream of the low-potential-side switching element is given for the shunt resistor in the first to third embodiments. The shunt resistor may be connected to a place other than the downstream of the low-potential-side switching element, for example, the upstream of the high-potential-side switching element.

While the semiconductor switching elements used in a semiconductor module are MOSFETs in the example given here, the present invention is not limited thereto and is applicable also to semiconductor modules in which IGBTs or thyristors are used. The present invention can also be applied to a semiconductor module in which the number of switching elements installed is 1.

The semiconductor module according to the present invention is installed in an electric power steering device in the examples given above, but can be installed in other devices as well.

Each of the embodiments of the present invention may be combined, modified, or omitted as appropriate without departing from the scope of the invention.

What is claimed is:
1. A semiconductor module comprising:
a plurality of base plates, each being formed into a plate shape from a conductive material;

power terminals extended from the plurality of base plates;
lands, which are parts of the plurality of base plates, and are to be used for placement and connection of elements;
switching elements put on and connected to the lands to control a current flowing in the power terminals; and
a shunt resistor put on and connected to part of the lands,
wherein the lands on which the shunt resistor is put and to which the shunt resistor is connected have slits formed so as to separate a main electric circuit in which a main current flows from detection-use terminals configured to detect electric portions of electrodes of the shunt resistor,
wherein the slits have leading end portions extending to a vicinity of the electrodes of the shunt resistor,
wherein the power terminals are aligned to form a line of power terminals,
wherein the semiconductor module further comprises a line of control terminals formed of low-power terminals, which are used for control and detection, and are aligned with respect to a side opposed to the line of power terminals, and
wherein the shunt resistor is placed on a side where the line of power terminals is located.

2. A semiconductor module, comprising:
a plurality of base plates, each being formed into a plate shape from a conductive material;
power terminals extended from the plurality of base plates;
lands, which are parts of the plurality of base plates, and are to be used for placement and connection of elements;
switching elements put on and connected to the lands to control a current flowing in the power terminals; and
a shunt resistor put on and connected to part of the lands,
wherein the lands on which the shunt resistor is put and to which the shunt resistor is connected have slits formed so as to separate a main electric circuit in which a main current flows from detection-use terminals configured to detect electric potentials of electrodes of the shunt resistor,
wherein the slit have leading end portions extending to a vicinity of the electrodes of the shunt resistor,
wherein bridge circuits of a plurality of phases each including a high-potential-side switching element, a low-potential-side switching element, and the shunt resistor are together encased in a resin mold to be integrated into one component.

3. The semiconductor module according to claim 1, wherein bridge circuits of a plurality of phases each including a high-potential-side switching element, a low-potential-side switching element, and the shunt resistor are together encased in a resin mold to be integrated into one component.

4. The semiconductor module according to claim 2, wherein a bridge circuit of one phase among the bridge circuits of the plurality of phases is arranged so as to be axisymmetric with a bridge circuit of another phase that is adjacent to the bridge circuit of the one phase, among the bridge circuits of the plurality of phases, and
wherein the axisymmetrically arranged bridge circuits of the one phase and the another phase share a terminal.

5. The semiconductor module according to claim 3, wherein a bridge circuit of one phase among the bridge circuits of the plurality of phases is arranged so as to be axisymmetric with a bridge circuit of another phase that is adjacent to the bridge circuit of the one phase, among the bridge circuits of the plurality of phases, and
wherein the axisymmetrically arranged bridge circuits of the one phase and the another phase share a terminal.

6. The semiconductor module according to claim 4, wherein the shared terminal has a width and a thickness that are substantially the same as a width and a thickness of a power supply terminal or a ground terminal in an independent bridge circuit of another semiconductor module which does not have bridge circuits sharing the power supply terminal or the ground terminal, respectively.

7. The semiconductor module according to claim 5, wherein the shared terminal has a width and a thickness that are substantially the same as a width and a thickness of a power supply terminal or a ground terminal in an independent bridge circuit of another semiconductor module which does not have bridge circuits sharing the power supply terminal or the ground terminal, respectively.

8. The semiconductor module according to claim 1,
wherein, in the lands on which the shunt resistor is put and to which the shunt resistor is connected, the detection-use terminals extend along an electrode width direction of the shunt resistor from corner portions of the lands closest to places on which the electrodes of the shunt resistor are put, and
wherein the slits are formed along the electrode width direction.

9. The semiconductor module according to claim 8, wherein bridge circuits of a plurality of phases each including a high-potential-side switching element, a low-potential-side switching element, and the shunt resistor are together encased in a resin mold to be integrated into one component.

10. The semiconductor module according to claim 8,
wherein a bridge circuit of one phase among the bridge circuits of the plurality of phases is arranged so as to be axisymmetric with a bridge circuit of another phase that is adjacent to the bridge circuit of the one phase, among the bridge circuits of the plurality of phases, and
wherein the axisymmetrically arranged bridge circuits of the one phase and the another phase share a terminal.

11. The semiconductor module according to claim 2,
wherein, in the lands on which the shunt resistor is put and to which the shunt resistor is connected, the detection-use terminals extend along an electrode width direction of the shunt resistor from corner portions of the lands closest to places on which the electrodes of the shunt resistor are put, and
wherein the slits are formed along the electrode width direction.

12. The semiconductor module according to claim 11, wherein the power terminals are aligned to form a line of power terminals,
wherein the semiconductor module further comprises a line of control terminals formed of low-power terminals, which are used for control and detection, and are aligned with respect to a side opposed to the line of power terminals, and
wherein the shunt resistor is placed on a side where the line of power terminals is located.

13. The semiconductor module according to claim 11,
wherein a bridge circuit of one phase among the bridge circuits of the plurality of phases is arranged so as to be axisymmetric with a bridge circuit of another phase that is adjacent to the bridge circuit of the one phase, among the bridge circuits of the plurality of phases, and wherein the axisymmetrically arranged bridge circuits of the one phase and the another phase share a terminal.

* * * * *